(12) United States Patent
Hollars et al.

(10) Patent No.: US 9,947,531 B2
(45) Date of Patent: Apr. 17, 2018

(54) HIGH RATE SPUTTER DEPOSITION OF ALKALI METAL-CONTAINING PRECURSOR FILMS USEFUL TO FABRICATE CHALCOGENIDE SEMICONDUCTORS

(71) Applicant: NUVOSON, INC., Milpitas, CA (US)

(72) Inventors: Dennis R. Hollars, Madera, CA (US);
Puthur Paulson, Milpitas, CA (US);
Don Person, Milpitas, CA (US);
Arthur C. Wall, Milpitas, CA (US)

(73) Assignee: NUVOSUN, INC., Milpitas, CA (US)

( * ) Notice: Subject to any disclaimer, the term of this patent is extended or adjusted under 35 U.S.C. 154(b) by 0 days.

(21) Appl. No.: 15/543,141

(22) PCT Filed: Dec. 17, 2015

(86) PCT No.: PCT/US2015/066266
§ 371 (c)(1),
(2) Date: Jul. 12, 2017

(87) PCT Pub. No.: WO2016/114895
PCT Pub. Date: Jul. 21, 2016

(65) Prior Publication Data
US 2017/0372897 A1 Dec. 28, 2017

Related U.S. Application Data

(60) Provisional application No. 62/102,398, filed on Jan. 12, 2015.

(51) Int. Cl.
*H01L 21/02* (2006.01)
*C23C 14/58* (2006.01)
(Continued)

(52) U.S. Cl.
CPC ........ *H01L 21/02568* (2013.01); *C22C 29/00* (2013.01); *C23C 14/0057* (2013.01);
(Continued)

(58) Field of Classification Search
CPC ......... H01L 21/02266; H01L 21/02417; H01L 21/02485; H01L 21/02568; H01L 45/14;
(Continued)

(56) References Cited

U.S. PATENT DOCUMENTS 5,994,163 A 11/1999 Bodegard et al.
2011/0100460 A1 5/2011 Bryden et al.
(Continued)

FOREIGN PATENT DOCUMENTS

EP 2410556 A2 1/2012
EP 2818574 A1 12/2014
(Continued)

*Primary Examiner* — Eduardo A Rodela
(74) *Attorney, Agent, or Firm* — Kagan Binder, PLLC

(57) ABSTRACT

The present invention provides methods to sputter deposit films comprising alkali metal compounds. At least one target comprising one or more alkali metal compounds and at least one metallic component is sputtered to form one or more corresponding sputtered films. The at least one target has an atomic ratio of the alkali metal compound to the at least one metallic component in the range from 15:85 to 85:15. The sputtered film(s) incorporating such alkali metal compounds are incorporated into a precursor structure also comprising one or more chalcogenide precursor films. The precursor structure is heated in the presence of at least one chalcogen to form a chalcogenide semiconductor. The resultant chalcogenide semiconductor comprises up to 2 atomic percent of alkali metal content, wherein at least a major portion of the alkali metal content of the resultant chalcogenide semiconductor is derived from the sputtered film(s) incorporating the alkali metal compound(s). The chalcogenide semiconductors are useful in microelectronic devices, including solar cells.

14 Claims, 10 Drawing Sheets

(51) Int. Cl.
    *C23C 14/06*     (2006.01)
    *C23C 14/34*     (2006.01)
    *H01L 31/18*     (2006.01)
    *C22C 29/00*     (2006.01)
    *H01L 31/032*     (2006.01)
    *H01L 31/0749*     (2012.01)
    *C23C 14/00*     (2006.01)
    *H01L 45/00*     (2006.01)
    *H01L 31/02*     (2006.01)

(52) U.S. Cl.
    CPC ...... *C23C 14/0623* (2013.01); *C23C 14/0694* (2013.01); *C23C 14/3464* (2013.01); *C23C 14/5806* (2013.01); *H01L 21/02266* (2013.01); *H01L 21/02417* (2013.01); *H01L 21/02485* (2013.01); *H01L 21/02631* (2013.01); *H01L 31/02008* (2013.01); *H01L 31/0322* (2013.01); *H01L 31/0749* (2013.01); *H01L 31/18* (2013.01); *H01L 31/188* (2013.01); *H01L 45/141* (2013.01); *H01L 45/16* (2013.01); *H01L 45/1625* (2013.01)

(58) Field of Classification Search
    CPC ... H01L 45/141; H01L 45/16; H01L 45/1625; H01L 31/00; H01L 31/02008; H01L 31/188; H01L 27/142
    See application file for complete search history.

(56) References Cited

U.S. PATENT DOCUMENTS

| | | |
|---|---|---|
| 2011/0162705 A1 | 7/2011 | Popa et al. |
| 2011/0168243 A1 | 7/2011 | Elowe et al. |
| 2011/0192453 A1 | 8/2011 | DeGroot et al. |
| 2011/0192454 A1 | 8/2011 | Feist et al. |
| 2011/0226336 A1 | 9/2011 | Gerbi et al. |
| 2011/0284134 A1 | 11/2011 | Nichols et al. |
| 2012/0217157 A1 | 8/2012 | Zhang et al. |
| 2014/0034491 A1 | 2/2014 | Zhang et al. |
| 2014/0224317 A1 | 8/2014 | Feist et al. |

FOREIGN PATENT DOCUMENTS

| | | |
|---|---|---|
| WO | 2012/054467 A2 | 4/2012 |
| WO | 2012/147985 A1 | 11/2012 |

US 9,947,531 B2

HIGH RATE SPUTTER DEPOSITION OF ALKALI METAL-CONTAINING PRECURSOR FILMS USEFUL TO FABRICATE CHALCOGENIDE SEMICONDUCTORS

PRIORITY CLAIM

This application claims priority to International Application No. PCT/US2015/066266, filed Dec. 17, 2015, which in turn claims priority to U.S. Provisional Patent Application No. 62/102,398, filed Jan. 12, 2015, wherein the disclosures of these applications are incorporated herein by reference in their respective entireties for all purpose.

FIELD OF THE INVENTION

The present invention relates to methods of making chalcogenide semiconductors with alkali metal content. More particularly, the present invention relates to methods comprising sputtering at least one target comprising one or more alkali metal compounds and at least one metallic component to form one or more corresponding sputtered films. The at least one target has an atomic ratio of the alkali metal compound to the at least one metallic component in the range from 15:85 to 85:15. The sputtered film is incorporated into a precursor structure comprising these sputtered films as well as one or more chalcogenide precursors. The precursor structure is heated in the presence of at least one chalcogen to form a chalcogenide semiconductor. The sputtered film(s) incorporating the alkali metal compound(s) are present in an amount such that the resultant chalcogenide semiconductor comprises up to 2 atomic percent of alkali metal content and such that a major portion of the alkali metal content of the resultant chalcogenide semiconductor is derived from the sputtered film(s) incorporating the alkali metal compound(s).

BACKGROUND OF THE INVENTION

Both n-type chalcogenide compositions and/or p-type chalcogenide compositions have been incorporated into components of heterojunction photovoltaic devices. The p-type chalcogenide compositions have been used as the photovoltaic absorber region in these devices. Illustrative p-type, photovoltaically active chalcogenide compositions often include sulfides and/or selenides of at least one or more of aluminum (Al), copper (Cu), indium (In), and/or gallium (Ga). More typically at least two or even all three of Cu, In, and Ga are present. Such materials are referred to as CIS, CIAS, CISS, CIGS, and/or CIGSS compositions, or the like (collectively CIGS compositions hereinafter).

Absorbers based upon CIGS compositions offer several advantages. As one, these compositions have demonstrated high power conversion efficiencies both at laboratory scale and increasingly at manufacturing scale. Thin film solar cells incorporating CIGS-based absorber layers can be very thin while still capturing a very high percentage of incident light. Such solar cells, therefore, present a potential low cost alternative to more traditional silicon based technologies. For example, in many devices, CIGS-based absorber layers have a thickness in the range from about 1 µm to about 2 µm. This is in contrast to much thicker silicon-based absorbers. Silicon-based absorbers have a lower cross-section for light capture and generally must be much thicker to capture the same amount of incident light.

According to one proposed technique for manufacturing chalcogenide semiconductor films, deposition methods are used in an initial stage to deposit and/or co-deposit all or a portion of the desired chalcogenide semiconductor constituents in one or more layers to form precursor film(s). At least a portion and sometimes all of the chalcogen(s) might not be included in the precursor film(s) at this stage. Instead, all or a portion of the chalcogen content might be incorporated into the precursor via chalcogenization at a later processing stage. In many instances, chalcogenization involves selenization and/or sulfurization. Chalcogenization often involves a thermal treatment of the precursor film(s) in the presence of chalcogen(s). This kind of thermal treatment not only incorporates chalcogen into the precursor but also converts the crystal structure of the film(s) into a more suitable crystal form for photoactive functionality.

Chalcogenide semiconductors are useful in a wide range of microelectronic devices including photovoltaic devices. Photovoltaic devices also are referred to as solar cells. Solar cells based on a chalcogenide semiconductor such as Cu(In, Ga)Se$_2$ achieve higher power conversion efficiency by incorporating alkali metal content, e.g., Na incorporation, into the semiconductor as is well known in the literature. This incorporation improves performance at least in part by passivation of defects at grain boundaries, influencing grain growth, and/or improving the p-doping of a thin chalcogenide semiconductor film.

In earlier research, when chalcogenide semiconductor solar cells were deposited on soda lime glass, it was discovered that Na diffused from the substrate and improved the device performance. Such diffusion was a relatively uncontrolled process. Accordingly, processes were developed in which films containing alkali metal content were purposefully deposited in combination with or prior to chalcogenide precursor films in order to provide a more controllable source of alkali metal to incorporate into the resultant semiconductor film.

In some instances, such alkali-metal containing films have been provided by evaporating Na containing salts such as Na$_2$Se, Na$_2$O, and/or NaF at temperature ranging from 600 C to 1200 C. The evaporation temperature has depended upon factors such as the specific material, thermal source designs, targeted film thickness, and deposition rate. In some cases, the material was in fact sublimed rather than evaporated depending on the pressure and temperature applied. Operation and control of NaF thermal sources can be very difficult when applied over large areas due to reasons such as source thermal uniformity, spitting, dependable deposition monitoring methods, and instability of thermal sources.

The use of sputtering techniques to incorporate sodium into chalcogenide semiconductors has been described in EP 2410556 A2; WO 2012054467 A2; US 2012/0217157 A1; and WO 2012147985 A1; and U.S. Pat. No. 5,994,163.

Sputtering offers the potential to provide much more uniform and controllable deposition of films. Many alkali metal compounds such as NaF, however, are not conductive. NaF, for instance, can be sputtered using RF sources, but the rate of deposition is low. Also, targets made from only such compounds lack thermal conductivity and durability and often crack. In addition, large power RF source are bulky, expensive and may not be as optimum for high throughput manufacturing as AC or DC sputtering strategies. This means that RF sputtering may not be as desirable for large scale manufacturing of chalcogenide semiconductor films that include alkali metal content. Accordingly, there is a need for improved sputtering methods that are used in the fabrication of chalcogenide semiconductors incorporating alkali metal-containing species.

SUMMARY OF THE INVENTION

The present invention provides methods that allow films comprising alkali metal compounds to be quickly sputter deposited with excellent control and uniformity. The methods involve sputtering at least one target comprising one or more alkali metal compounds and at least one metallic component to form one or more corresponding sputtered films. The at least one target has an atomic ratio of the alkali metal compound to the at least one metallic component in the range from 15:85 to 85:15 and thus is relatively rich in alkali metal content. By themselves, alkali metal compounds are generally not sufficiently conductive to be sputtered as effectively as desired by AC or DC sputtering techniques. The presence of the metallic component helps to make the targets more conductive and, therefore, substantially more compatible with a wider range of sputtering techniques, including RF, AC, and DC sputtering techniques.

The sputtered film(s) incorporating such alkali metal compounds are incorporated into a precursor structure comprising one or more of these sputtered film(s) as well as one or more chalcogenide precursor films. The precursor structure is heated in the presence of at least one chalcogen to form a chalcogenide semiconductor. The sputtered film(s) incorporating the alkali metal compound(s) are present in the precursor structure in an amount such that the resultant chalcogenide semiconductor comprises up to 2 atomic percent of alkali metal content and such that a major portion of the alkali metal content of the resultant chalcogenide semiconductor is derived from the sputtered film(s) incorporating the alkali metal compound(s). The chalcogenide semiconductors, in turn, are useful in a wide range of microelectronic devices, including solar cells.

The use of conductive sputter targets that are relatively rich in alkali metal compound content provides many advantages. The combination of constituents including at least one metallic component and at least one alkali metal compound are much more durable than sputter targets including alkali metal compounds alone. The relatively large amount of alkali metal compound content in the sputter targets means that relatively thin films can be sputter deposited uniformly and quickly to provide all or a portion of the alkali metal content to be incorporated into the resultant chalcogenide semiconductor.

The targets are richer in alkali metal content than is the resultant semiconductor and thus are used to form only part of the precursor structure. Because the alkali metal compound targets are used to form only a portion of the precursor structure, the amount of alkali content in the precursor structure, and hence the resultant chalcogenide semiconductor, can be easily tuned without having to provide substantially different targets for each desired precursor structure. If more alkali content is desired, thicker films are deposited using the targets. If less alkali content is desired, thinner films are deposited using the targets.

Another approach reported in the literature is to add small amounts of alkali material to typical materials used to fabricate a chalcogenide precursor (e.g. CuGa or CuInGa). A significant drawback of this approach is that those sputter targets often include very little Na, e.g., the atomic ratio of Na:Cu in the conventional targets is under 5:100 and even under 2:100. In order to prepare a precursor structure with enough alkali content, those targets must be sputtered to make a substantial part of precursor. This does not allow the precursor formulation to be tuned easily and separately. If a different composition is desired, a different target would be needed. Further, lower Na content in a Cu:NaF target would necessitate sputtering a thicker Cu:NaF film so that sufficient Na could be incorporated into the final chalcogenide semiconductor film. However, thicker Cu:NaF films leads to lower sputter power for a target including Cu and Ga so that an overall Cu/group III ratio in the precursor remains in the desired range (about 0.80 to about 0.90 in many instances). However, because Ga content in such a target is usually limited to <30 atomic percent gallium, lowering the sputter power results in lower Ga incorporation than is sufficient for a high efficiency device. In contrast, by using sputtering targets that are richer in alkali metal content, the present invention allows a major portion and even all of the desired alkali metal content to be incorporated into a relatively small portion of the precursor structure, while some or all of the desired Ga content is incorporated independently into other precursor portion(s).

As compared to using evaporation or sublimation to form thin films including alkali meal compounds, an advantage of using the sputtering targets of the present invention is that deposition rates at particular desired levels are very steady, uniform, and a strong function of power or current. For a given sputter system, the deposition rate as a function of power or current can be calibrated using simple empirical testing to determine the deposition rate associated with a particular power setting. Desired sputter rates and times are then easily selected as a function of power or current setting to deposit films at desired thicknesses with great accuracy. In addition, sputtering is very quick to turn on and off as compared to evaporation where a substantial amount of time is needed to reach steady state deposition rates.

For example, in illustrative modes of practice, optical emission spectroscopy (OES) has been used to demonstrate and monitor the stable emission of NaF as a strong function of power level while sputtering the targets. This shows a consistent and reliable deposition rate for the respective powers and power densities. Optical emission spectroscopy is an established process control technique for plasma processes. By detecting light from the electronic transitions of atoms, it is possible to identify and monitor the chemical species in a plasma. Elements that exist in a plasma environment, such as a sputter plasma, typically emit a characteristic set of photon energies as they relax from an excited state. The intensity of this emission can then be used as an indication of the amount of the material that is present. This OES data can be used in a closed loop control mode to controllably sputter NaF from the sputter targets over desired periods of time. OES feedback control is an added advantage of sputtering NaF rather than evaporating the material, due to the ability to rapidly and accurately measure and respond to the OES data to monitor and control the amount of material in the plasma, and hence the deposition rate and progress. In contrast, evaporation source often depends on a quartz crystal monitor to control the evaporation rate. Such a device often has to be placed in the direct path of the evaporation flux to get a reliable measurement. Also, loading of a quartz crystal from the deposition flux could reduce the life time of the crystal and thereby cause crystal failure.

In some embodiments, the metal component incorporated into the sputter targets can be one or more of the desired metal constituents of the resultant chalcogenide semiconductor. Examples of such metals include Cu, In, Ga, Al, Ag, combinations of these, and the like. An advantage of using such metal(s) as constituent(s) of the targets is that the metals are desired ingredients, not impurities. In other embodiments, any conductive material(s) that do not unduly deteriorate the CIGS layer performance could be used in the targets in combination with or as an alternative to metals.

By depositing the alkali metal compounds in one or more films that are only a portion of the precursor structure, the alkali metal content is incorporated into the resultant chalcogenide semiconductor by mass transfer phenomena believed to include at least diffusion effects.

In one aspect, the present invention relates to a method of making a chalcogenide semiconductor, comprising the steps of:
- (a) providing a substrate;
- (b) forming a precursor structure on the substrate, said precursor structure comprising one or more alkali metal compound-containing films and one or more chalcogenide semiconductor precursor films, wherein:
  - (i) each of the one or more alkali metal compound-containing films comprises at least one conductive species and at least one alkali metal compound, wherein the atomic ratio of the one or more alkali metal compounds to the at least one conductive species in the film is in the range from 15:85 to 85:15;
  - (ii) each of the one or more chalcogenide semiconductor precursor films comprises a chalcogenide semiconductor precursor,
  - (ii) each of the one or more alkali metal compound-containing films is formed by a method comprising sputtering at least one target comprising one or more alkali metal compounds and at least one conductive species, wherein the atomic ratio of the one or more alkali metal compounds to the at least one conducive species in said target is in the range from 15:85 to 85:15; and
  - (iii) the first film is present in the precursor structure an amount such that the chalcogenide semiconductor comprises up to 2 atomic percent alkali metal content based on the total composition of the chalcogenide semiconductor, and such that a major portion of the alkali metal content of the chalcogenide semiconductor is derived from the one or more alkali metal compound-containing films; and
- (c) heat treating the precursor structure in the presence of at least one chalcogen under conditions effective to convert at least a portion of the precursor structure into a chalcogenide semiconductor comprising up to 2 atomic percent of alkali metal content.

In another aspect, the present invention relates to a method of making a chalcogenide semiconductor, comprising the steps of:
- (a) providing a substrate;
- (b) sputtering one or more targets to form a first film on the substrate, said first film comprising at least one alkali metal compound and at least one conductive species, wherein the one or more targets comprise one or more alkali-metal compounds and one or more conductive species, and wherein the atomic ratio of the one or more alkali metal compounds to the one or more conductive species in said one or more targets is in the range from 15:85 to 85:15;
- (c) forming a second film comprising a chalcogenide semiconductor precursor on the first film, wherein the first and second films are formed in amounts such that the alkali metal content of the chalcogenide semiconductor contains up to 2 atomic percent of alkali metal content based on the total composition of the chalcogenide semiconductor and such that a major portion of the alkali metal content of the chalcogenide semiconductor is derived from the first film; and
- (d) heat treating the first and second films under conditions effective to convert at least a portion of the first and second films into an alkali metal-containing chalcogenide semiconductor.

In another aspect, the present invention relates to a method of making a chalcogenide semiconductor, comprising the steps of:
- (a) providing a substrate;
- (b) forming a chalcogenide semiconductor precursor film on the substrate;
- (c) sputtering one or more targets to form an additional film on the substrate, said additional film comprising at least one alkali metal compound and at least one conductive species, wherein the one or more targets comprise one or more alkali-metal compounds and one or more conductive species, and wherein the atomic ratio of the one or more alkali metal compounds to the one or more conductive species in said one or more targets is in the range from 15:85 to 85:15, and wherein the chalcogenide semiconductor precursor film and the additional film are formed in amounts such that the alkali metal content of the chalcogenide semiconductor contains up to 2 atomic percent of alkali metal content based on the total composition of the chalcogenide semiconductor and such that a major portion of the alkali metal content of the chalcogenide semiconductor is derived from the additional film; and
- (d) heat treating the chalcogenide semiconductor precursor film and the additional film under conditions effective to convert at least a portion of the sodium containing film and the chalcogenide semiconductor precursor film into a Na-containing chalcogenide semiconductor.

DETAILED DESCRIPTION OF PRESENTLY PREFERRED EMBODIMENTS

The embodiments of the present invention described below are not intended to be exhaustive or to limit the invention to the precise forms disclosed in the following detailed description. Rather a purpose of the embodiments chosen and described is so that the appreciation and understanding by others skilled in the art of the principles and practices of the present invention can be facilitated. All patents, patent applications, and publications cited herein are incorporated herein by reference in their respective entireties for all purposes. The foregoing detailed description has been given for clarity of understanding only. No unnecessary limitations are to be understood therefrom. The invention is not limited to the exact details shown and described, for variations obvious to one skilled in the art will be included within the invention defined by the claims.

The present invention is useful for preparing chalcogenide semiconductors that include one or more alkali metal constituents. These alkali metal-containing semiconductors, in turn, are useful in a wide range of microelectronic devices. Examples of microelectronic devices include but are not limited to photovoltaic devices (also referred to as solar cells), laser diodes, transistors, lasers, quantum heterostructures, liquid crystal displays, substrates for epitaxial growth of other semiconductors, semi-insulating crystals, mobile phones, satellite circuitry, aircraft circuitry, microprocessors, integrated circuits, sensors, detectors, optical windows, integrated circuits, power electronics, and the like. In many embodiments, the alkali metal-containing semiconductors incorporated into these devices may be p-type semiconductors. Films incorporating the alkali metal-containing semiconductors may be constituents of one or more components of features such as homojunctions, heterojunctions, metal-semiconductor junctions that may be rectifying (e.g., Schottky barrier) or non-rectifying (ohmic), and the like. Exemplary junctions may be formed as p-n, p-i-n, n-p-n, p-n-p, p-metal contact, n-metal contact, junctions, or the like.

Figure 1:
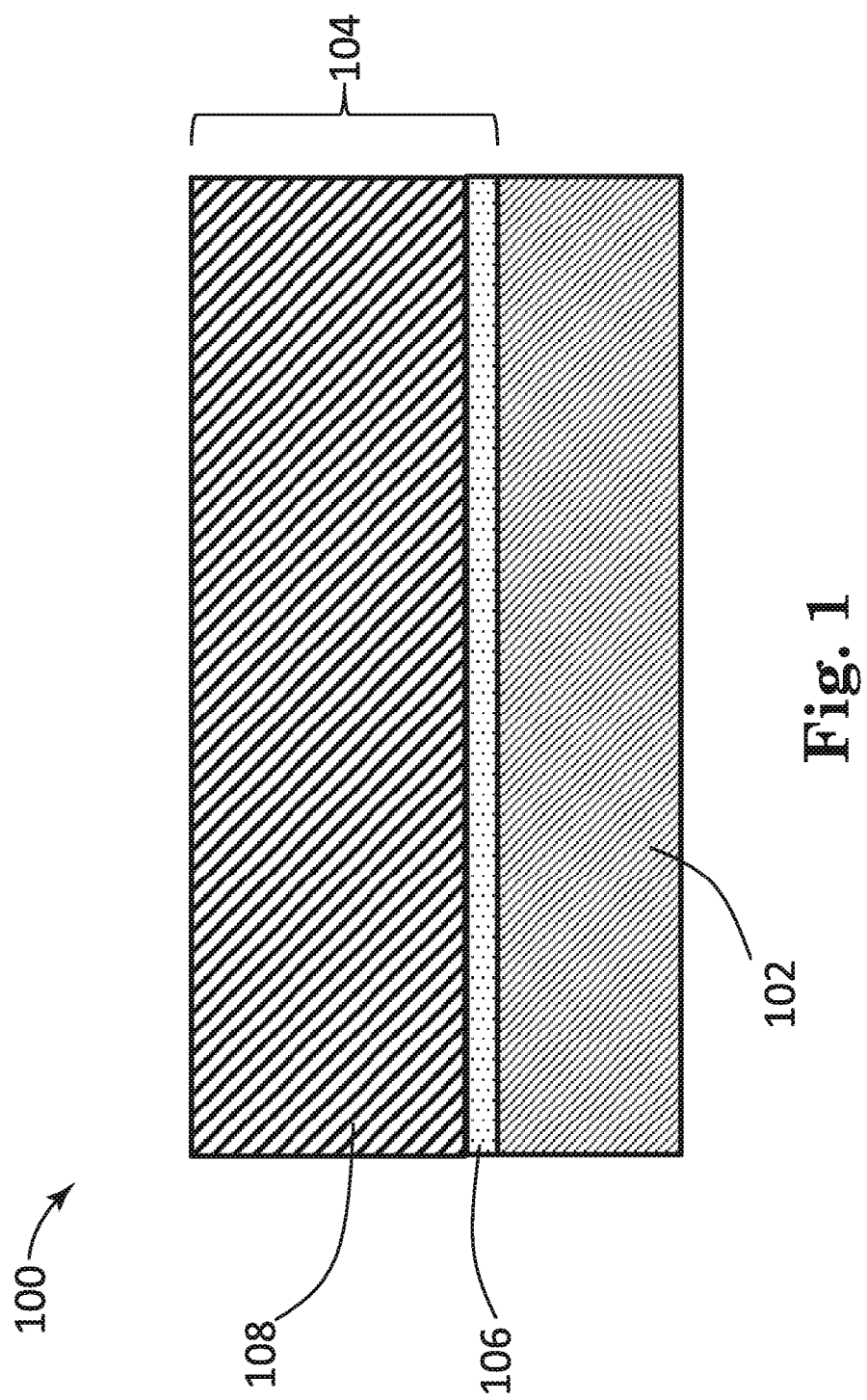
FIG. 1 schematically shows a cross section of a workpiece on which a precursor of the present invention is formed on a substrate.

As an example of a preferred mode of practice, and as shown in FIG. 1, a workpiece 100 comprises a substrate 102. A precursor structure 104 is provided on the substrate 102. The precursor structure 104 includes a first film 106 proximal to the substrate 102 and a second film 108 distal from the substrate 102. The first and second films 106 and 108 may be in direct physical contact with each other or may be spaced apart, e.g., separated by one or more interposed layers. Because the order in which the first and second films 106 and 108 are formed can vary, and because the precursor structure 104 may include other, optional layers, other embodiments of workpieces incorporating one or more of such films in other configurations are described below with respect to FIGS. 2 to 4.

The first film 106 comprises at least one alkali metal compound and at least one conductive species such as one or more metals or the like. The atomic ratio of the one or more alkali metal compounds to the one or more conductive species in the first film 106 as deposited is in the range of 15:85 to 85:15, preferably 20:80 to 80:20, more preferably 40:60 to 80:20, and even 60:40 to 80:20. The first film 106 is present in a limited amount such that the resultant chalcogenide semiconductor comprises up to 2 atomic percent, even 0.01 to 2 atomic percent, or even 0.1 to 2 atomic percent of alkali metal content based on the total composition of the chalcogenide semiconductor and such that a major portion of the alkali content of the chalcogenide precursor is derived from the first film 106. As used herein, a major portion means at least 20%, preferably at least 50%, more preferably at least 90% and even more preferably 100%.

As used herein, the atomic percent of alkali metal content in a film is determined by secondary ion mass spectroscopy (SIMS). SIMS is a technique used to analyze the composition of solid surfaces and thin films by sputtering the surface of the specimen with a focused primary ion beam and collecting and analyzing ejected secondary ions. The mass/charge ratios of these secondary ions are measured with a mass spectrometer to determine the elemental, isotopic, or molecular composition of the surface to a depth of 1 to 2 nm. SIMS can be applied not only qualitatively but also quantitatively using a comparison to a standard or other calibration technique. SIMS is a highly sensitive surface analysis technique, with elemental detection limits as low as parts per million to parts per billion.

The first film 106 may be deposited as one or more layers having an overall thickness within a wide range. In many embodiments, the first film 106 as deposited may have a thickness in the range from 10 nm to 150 nm, preferably 20 nm to 100 nm, more preferably 40 nm to 100 nm.

According to the present invention, the first film 106 is formed by a method comprising sputtering at least one sputter target comprising one or more alkali metal compounds and one or more conductive species. The atomic ratio of the one or more alkali metal compounds relative to the one or more conductive species in the one or more targets is in the range from 15:85 to 85:15, preferably 20:80 to 80:20, more preferably 40:60 to 80:20, and even 60:40 to 80:20. In illustrative embodiments, targets can be a single phase or multiple phases.

As used herein, an alkali metal compound refers to any material comprising two or more elements linked by covalent and/or ionic bonds, wherein at least one element is an alkali metal and at least one other element is a non-alkali metal. Alkali metal compounds also include alloys and intermetallic compositions including at least one alkali metal and at least one other metal. The alkali metal elements most useful in the practice of the present invention are Na, K, Li, or a combination of Na, K and Li. Some embodiments include at least two or even all three of Na, K, and Li. Examples of alkali metal compounds include oxides, fluorides, chlorides, bromides, molybdates, hydroxides, tungstates, sulfates, titanates, metavanadates, sulfides, selenides, carbides, nitrides, and combinations of these. Fluorides, sulfides, and selenides are presently preferred.

Specific examples of alkali metal compounds include one or more of $Na_2Se$, $Na_2O$, $Na_2S$, $NaF$, $Li_2Se$, $Li_2O$, $Li_2S$, $LiF$, $K_2Se$, $K_2O$, $K_2S$, $KF$, $Na_xLi_yZ$, $Na_xK_yZ$, and/or $K_xLi_yZ$ wherein x+y is 2, x:y is 0.01:100 to 100:0.01, and Z is one or more of Se, O, and/or S, and/or $Na_xLi_yF$, wherein x+y is 1 and x:y is 0.01:100 to 100:0.01. $NaF$ and/or $Na_2Se$ are preferred. Compounds comprising all three of Na, K, and Li also may be used wherein the ratio of one of the alkali metals to the other two alkali metals may be in the range from 0.01:100 to 100:0.01. $NaF$ is more preferred. One advantage of fluoride embodiments is that F has been shown to work well in these applications, generally most if not all of the F is lost or removed in subsequent high temperature processing used to accomplish chalcogenization/annealing, and even if F remains such as in trace amounts, the F does not unduly impact device performance.

As used herein, an electrically conductive species refers to any species that allows the flow of electricity in one or more directions and comprise Cu or is a species that has at least 10%, preferably at least 30%, more preferably at least 50%, and even more preferably at least 80% of the conductivity of pure copper. Examples of conductors include metals, superconductors, semiconductors, graphite, combinations of these, and the like. Electrically conductive species may be in the form of ions, elements, compounds, alloys, or other compositions. In many embodiments, an electrically conductive species is a metal present in the targets as a pure metal, a metal alloy, an intermetallic composition, and/or the like. Examples of suitable metals include Cu, In, Ga, Al, Ag, Sb, combinations of these, and the like. An advantage of such metals is that such metals often are desired ingredients, not impurities, of the resultant chalcogenide semiconductor. Some suitable conductive materials such as Ag are even more conductive than copper. A suitable conductive species such as Al has about 61% of the conductivity of copper.

In some embodiments, one or more of these metal constituents may function as dopants or alloying agents in the resultant chalcogenide semiconductor. Dopants and/or alloying agents (if any) may be introduced in multiple ways using a wide range of techniques well known in the industry. For example, a target itself may be doped. Dopant source(s) may be provided in the form of one or more separate targets. As still yet another option, evaporated fluidized material or gas (i.e. $CF_4$, $SF_6$, etc) may be introduced into the chamber to generate a desired doping level.

In some modes of practice, the sputter targets also may include metal compounds even if such compounds are not electrically conductive. For instance, examples of copper compounds include copper fluoride, copper sulfide, copper selenide, copper nitride, copper carbide, combinations of these, and the like. If non-conductive embodiments of such compounds are present, the amount of such compounds is limited such that the resultant target is still compatible with the desired sputter technique, e.g., RF, AC, or DC sputtering.

The sputtering target may include small amounts of impurities that do not unduly degrade the performance of chalcogenide semiconductors fabricated using the sputtering targets. For example, a target may include small amounts of selenium, aluminum, sulfur or group VII or VIII elements present as impurities in a sodium salt.

The alkali metal-containing sputtering targets may be provided according to a variety of methods. Exemplary methods include casting, injection molding, twin arc wire spraying (TWAS), plasma spraying, and powder metallurgy. In some modes of practice, the sputtering targets made by such methods may exclude non-trace amounts of selenium prior to being used in a sputtering apparatus. Such targets may be advantageously used in a reactive sputtering process with an atmosphere that includes evaporated selenium or hydrogen selenide to form CIGS(Na) layers.

The targets containing the alkali metal compounds and the electrically conductive species may be provided with a wide variety of shapes. For example, in some embodiments, the sputtering targets may have a hollow cylindrical shape optionally formed on a cylindrical sputtering target support (e.g., a backing tube, such as a stainless steel, titanium, aluminum, and/or other suitable material(s)). Alternatively, the targets may comprise a hollow cylinder or hollow rings ring made without an interior support. Details for forming sputter targets using molding techniques are further described in U.S. Patent Pub. No. 2011/0089030 and incorporated herein by reference in its entirety. Alternatively, planar targets may be used instead. If more than one alkali-containing sputtering target is used, the alkali metal-containing targets may have the same or different shapes. One, exemplary embodiment of a suitable sputter target including an alkali metal compound is a cylindrically shaped sputter target.

The second film 108 comprises a precursor of a chalcogenide semiconductor. As used herein, a precursor of a chalcogenide semiconductor is a composition that upon heating at a temperature in the range from 400 C to 700 C, preferably 550 C to 650 C, or upon heating at a temperature in such ranges in the presence of at least one chalcogenide, is converted into a chalcogenide semiconductor, preferably a crystalline chalcogenide semiconductor, more preferably a polycrystalline chalcogenide semiconductor. Under this definition, both the first and second films 106 and 108 may constitute a precursor of a chalcogenide semiconductor in some embodiments. The two films differ in that the second film 108 is leaner in alkali metal content than the first film 106. The second film 108 desirably is sufficiently free of alkali metal content such that a major portion of the alkali metal content of the resultant chalcogenide semiconductor is derived from the first film 106. In many embodiments, the second film 108 contains less than 0.5, or even less than 0.1, or even less than 0.001 atomic percent of alkali metal content based on the total composition of the second film 108.

In many suitable embodiments, the second film 108 desirably includes at least Cu and In, and at least one chalcogen as deposited. The ingredients incorporated into the second film 108 also may include one or more other optional constituents. In preferred embodiments, optional constituents include at least one of Ga, Al, or combinations of these. Other optional constituents include Na, Li, K, Sb, Ag, Al, combinations of these, and the like. In some embodiments, one or more of these optional constituents may function as dopants in the resultant chalcogenide semiconductor.

Preferred chalcogenide precursor compositions include Cu, In and at least one of gallium and/or aluminum. The amount of In and optional Ga and/or Al incorporated into the second film 108 may vary over a wide range. The In, Ga, and Al are known as Group III elements. Desirably, the Cu/III ratio is less than 1, or preferably 0.8 to 0.9. When Cu and the Group III elements are present in stoichiometric amounts, this ratio is 1. Cu is in excess when this ratio is greater than 1. Cu is deficient or lacking when Cu/III is less than 1. A Cu deficiency is desirable to create a semiconductor from the CIGS precursor structure as otherwise the resultant film could be conductive rather than being a desired semiconductor. Some or all of the desired In, Ga (if any), and Al (if any) may be incorporated into the first film 106 as deposited rather than in only the second film 108. Optionally, a portion of the desired Group III content may be added in later processing steps after an initial portion of the film constituents are deposited.

As one option, all or a portion or none of the desired chalcogen content of the resultant chalcogenide semiconductor can be incorporated into the second film 108 as deposited. For example, in some modes of practice, second film is deposited without chalcogen content. In other modes of practice, second film 108 includes a substoichiometric amount of chalcogen. Optionally, additional chalcogen content can be incorporated into the film 108 at a later processing stage such as by using chalcogenization techniques. Chalcogen(s) incorporated into the second film 108 generally include one or more of Se, S, and/or Te. Se and/or S are more preferred. Additional chalcogen content optionally may be added to the precursor structure 104 during subsequent processing such as during a chalcogenization treatment. The first and second films 106 and 108 can be subjected to separate heating/chalcogenizaton treatments. Alternatively and more preferably, the entire precursor structure 104 is deposited and then chalcogenized and/or annealed. Techniques for forming precursor films with sub-stoichiometric chalcogen content are further described in US Publication No. 2011-0226336.

Whereas at least a portion of the first film 106 is deposited using sputtering techniques, the second film 108 can be formed using a wide range of techniques or combinations of techniques. Exemplary techniques include sputtering, evaporation, chemical vapor deposition, electrodeposition, and combinations of these. For industrial scale purposes, techniques that are compatible with roll to roll or large area vacuum processing are preferred.

In many embodiments, sputtering techniques are used to deposit all or a portion of the second film 108. One or more targets can be used to accomplish this sputtering. If multiple targets are used, confocal sputtering techniques can be used. Targets can be a single phase or multiple phases. In one mode of practice, an exemplary target includes $Cu_xIn_yGa_z$, wherein x, y, and z are 0.46, 0.38, and 0.16 respectively, although many other compositions are suitable. In another example, the second film is sputtered using a combination of a first target including Cu and Ga with an atomic ratio of Ga:Cu of 27:73 and a second target including In. Additional target embodiments suitable for forming chalcogenide precursor films are described in U.S. Patent Pub. No. US 2011/0226336.

Examples of suitable precursor films useful as the second film 108 and other chalcogenide precursor films in the practice of the present invention, and methods of forming such films, are widely known. By way of example, exemplary precursor films and method of making precursor films are described in U.S. Patent Pub. No. 20110162705; U.S. Patent Pub. No. 20110284134; U.S. Patent Pub. No. 20110192454; U.S. Patent Pub. No. 20110100460; U.S. Patent Pub. No. 20110226336; U.S. Patent Pub. No. 20110168243; U.S. Patent Pub. No. 20110192453; and U.S. Patent Pub. No. 2014/0224317. Each of these patent documents is incorporated herein by reference in its respective entirety for all purposes.

The second film 108 as deposited may have a thickness in a wide range. Generally, if the overall film is too thin, the film may not be continuous after post-processing (e.g., annealing and/or chalcogenization as described below) or may yield a final chalcogenide semiconductor having a low cross-section for capturing incident light. Layers that are too thick are wasteful in that more material would be used than is needed for effective capture of incident light. Balancing such concerns, exemplary embodiments of the second film 108 have a thickness in the range from about 0.4 µm to about 2 µm, preferably about 0.6 µm to about 1.7 µm, more preferably 0.8 µm to about 1.5 µm.

In illustrative embodiments, sputtering techniques are used to deposit each of the first and second films 106 and 108. Each of the first and second films 106 and 108 independently may be deposited using a wide range of sputtering techniques. Examples of sputtering techniques include RF, DC, and AC sputtering techniques. DC and AC sputtering techniques are preferred as these tend to be more cost effective, easier to control and tune.

Prior to sputtering or pre-sputtering, a suitable base pressure is typically established, and the deposition is initiated after the base pressure or lower pressure is reached. In exemplary embodiments, the base pressure may be on the order of about $10^{-4}$ Torr or less, preferably $10^{-5}$ Torr or less, more preferably $10^{-6}$ Torr or less. In one mode of practice, a base pressure of $1\times10^{-6}$ Torr or less would be suitable. After the base pressure is reached, pre-sputtering and then sputtering may occur at any suitable operating pressure(s). Exemplary operating pressures are in the range from about 1 to about 100 mTorr, preferably about 1 mTorr to about 20 mTorr. In one mode of practice, an operating pressure of about 2 to about 8 mTorr would be suitable.

The operating pressure conveniently is established and maintained by flowing one or more suitable sputtering gases through the sputtering chamber. Exemplary sputtering gases include Ar, $O_2$, $H_2$, $N_2$, combinations of these and the like. In one mode of practice, a flow of 20 sccm Ar would be suitable to establish an operating pressure of about 5 mTorr.

In selecting sputtering parameters, one consideration is to avoid undue collisions of the desired species from the point of creation to the arrival at the growing film at the substrate 102. Those knowledgeable in the art consider this to mean that the "mean free path" of the sputtered species desirable is greater than the target-to-substrate distance. To practice such principles, exemplary modes of practice are characterized by a target to substrate distance in the range from at least about 1 cm, preferably at least about 3 cm up to about 30 cm, more preferably up to about 15 cm, with sputter pressures of at least about 0.5 mTorr, preferably at least about 3 mTorr up to about 50 mTorr, more preferably up to about 3 to 5 mTorr.

Figure 2:
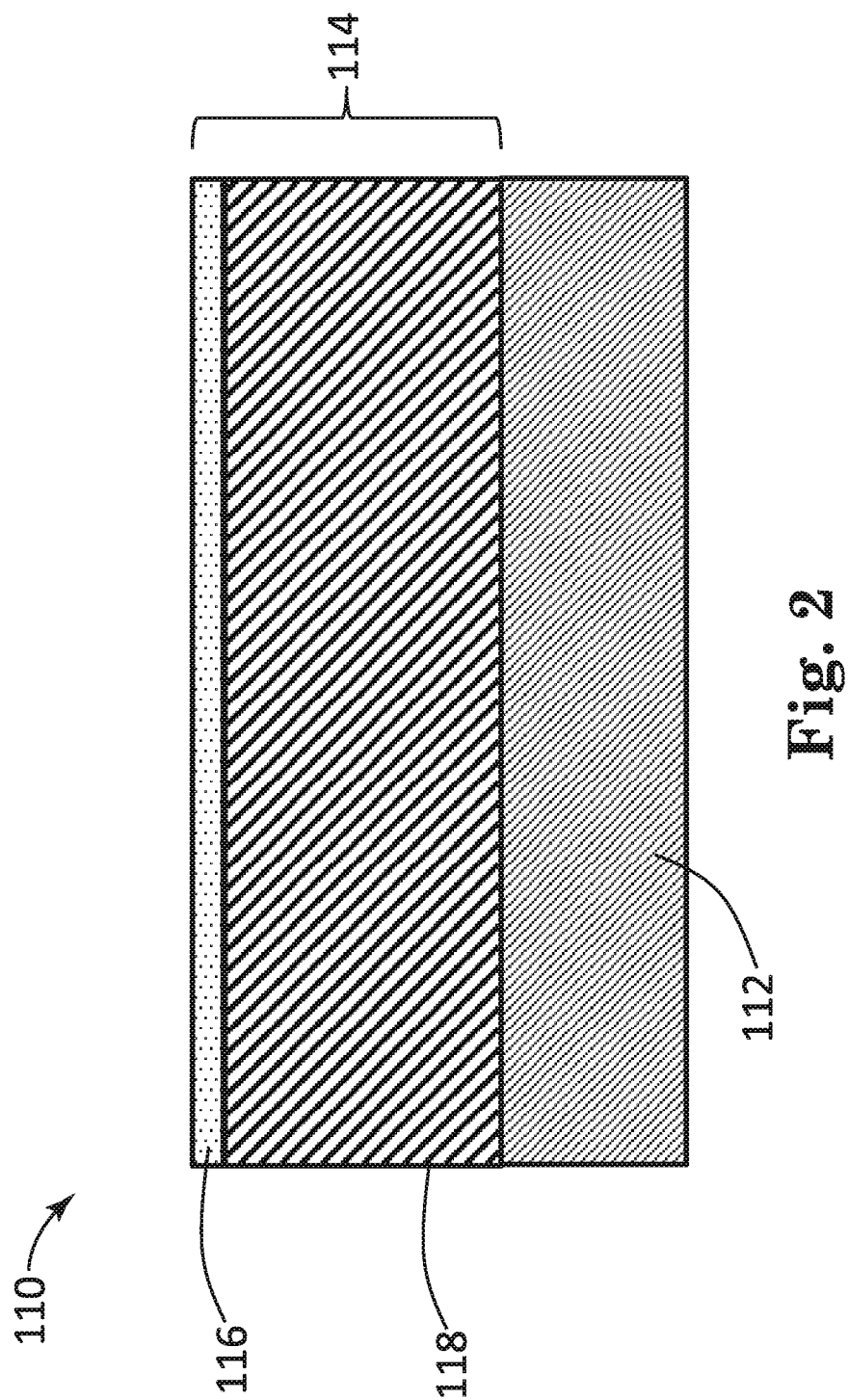
FIG. 2 schematically shows a cross section of an alternative embodiment of a workpiece on which a precursor of the present invention is formed on a substrate.

The order and manner in which the first and second films 106 and 108 of FIG. 1 are deposited can vary. For example, in contrast to the approach shown in FIG. 1, the second film 108 may be formed on the substrate 102 initially, and then the first film 108 is formed on the second film. For example, FIG. 2 shows a workpiece 110 comprising a substrate 112. A precursor structure 114 is provided on the substrate 112. The precursor structure 114 includes an alkali metal-containing first film 116 distal from the substrate 112 and a second film 118 proximal to the substrate 112.

Figure 3:
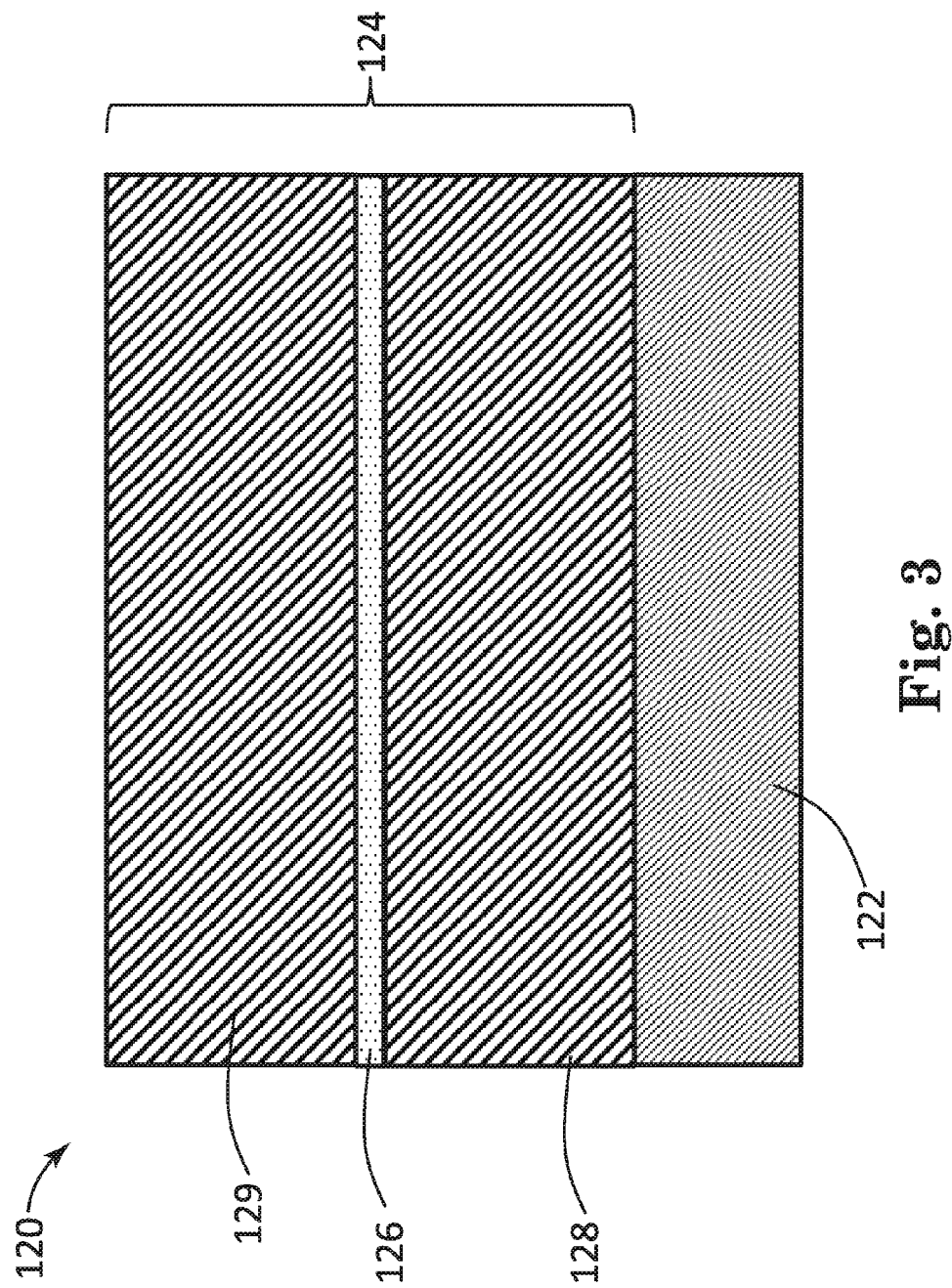
FIG. 3 schematically shows a cross section of an alternative embodiment of a workpiece on which a precursor of the present invention is formed on a substrate.

In addition to the first and second films, the precursor structure optionally may include one or more additional layers. For example, FIG. 3 shows a workpiece 120 comprising a substrate 122. A precursor structure 124 is provided on the substrate 122. The precursor structure 124 includes an alkali metal-containing first film 126 sandwiched between a, second film 128 and an additional chalcogenide precursor film 129.

Figure 4:
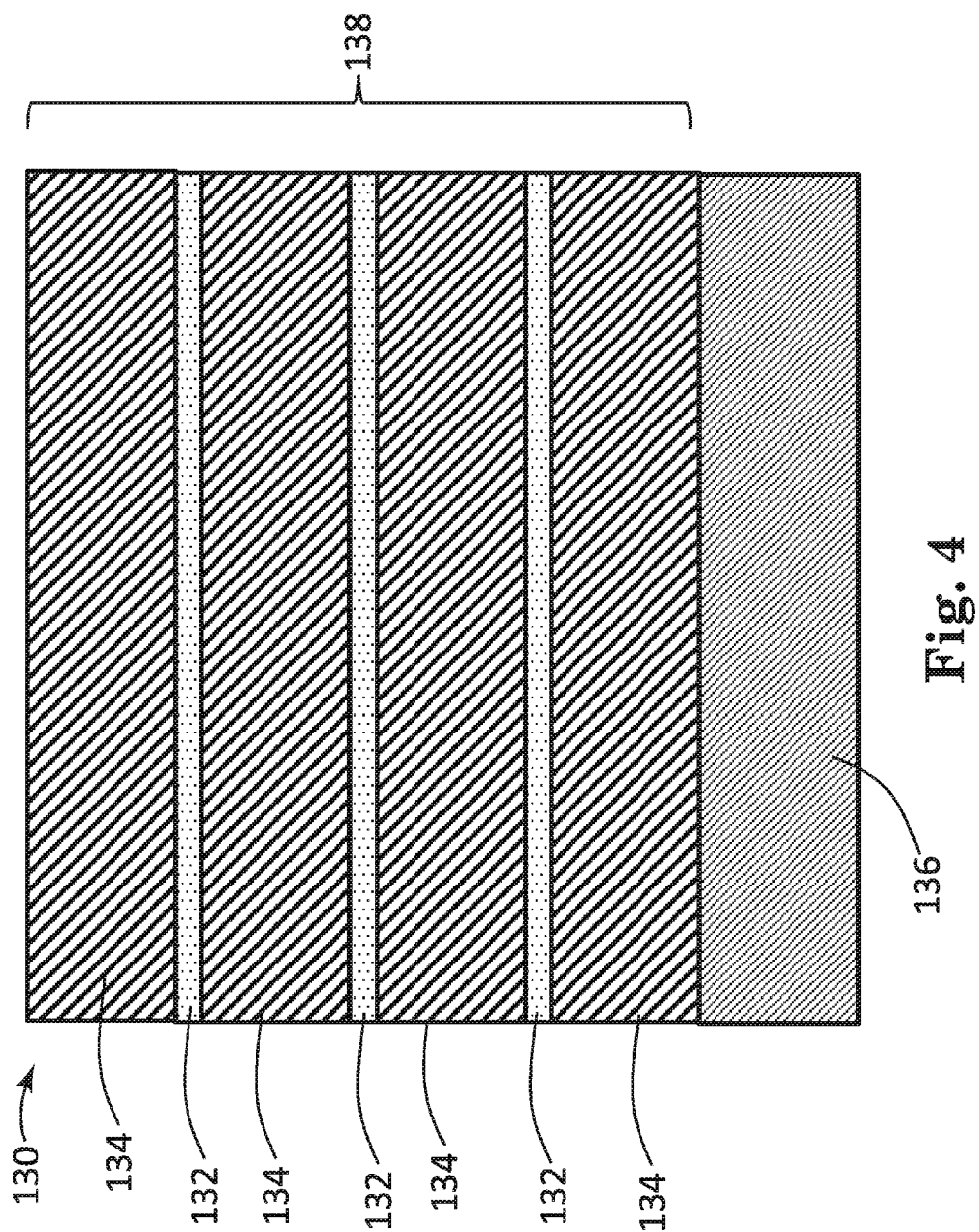
FIG. 4 schematically shows a cross section of an alternative embodiment of a workpiece on which a precursor of the present invention is formed on a substrate.

As another example, FIG. 4 show an embodiment of a workpiece 130 having a plurality of alkali metal-containing layers 132 and a plurality of chalcogenide precursor layers 134 supported on substrate 136. Each of the alkali containing layers 132 may have compositions that are the same or different, but each includes at least 15 atomic percent of alkali content. Each of the plurality of chalcogenide precursor layers 134 may have compositions that are the same or different. The alkali content of the chalcogenide layers 134 is limited so that the precursor structure 138 as a whole is limited to including up to about 2 atomic percent alkali content.

In each of FIGS. 2 through 4, films 116, 126 and 132 correspond to first film 106 of FIG. 1. In each of FIGS. 2-4, films 118, 128, and 134 correspond to second film 108 of FIG. 1.

Referring again to FIG. 1, after the precursor structure 104 is provided on the substrate 102, the precursor structure 104 is heat treated in the presence of at least one chalcogen selected from S, Se, and/or Te, preferably S and/or Se, more preferably Se. Heat treating occurs under conditions effective to convert at least a portion of the precursor structure 102 into an alkali metal-containing chalcogenide semiconductor. The one or more chalcogen sources used for chalcogenization during the heat treatment may include one or more gases, solids, liquids, gels, combinations of these, and the like. Exemplary gas phase sources of chalcogen include $H_2S$, $H_2Se$, combinations of these, and the like. In some illustrative embodiments, the gas source is generated as vapor via evaporation from solid or liquid material and is present in an overpressure in order to facilitate mass transfer of chalcogen into the film. Exemplary solid phase chalcogen sources include S or Se, combinations of these, and the like. In some illustrative embodiments, a solid cap of one or more chalcogen-containing species is provided in intimate contact with the surface of the precursor film to carry out chalcogenization. In other illustrative embodiments, chalcogenization may be carried out by exposing the precursor structure 102 to both gas phase chalcogen source(s) as well as one or more solid caps.

The heat treatment generally involves exposing the precursor structure 102 to at least one chalcogen source under conditions effective to cause the chalcogen content of the structure to increase. For instance, if the precursor includes a sub-stoichiometric amount of chalcogen(s), chalcogenization can be carried out so that the chalcogen content is increased to be substantially at the stoichiometric amount, or even in excess relative to the stoichiometric amount. Because the chalcogen content of the precursor structure 102 is increased to form a chalcogenide semiconductor, such a treatment also is referred to as a chalcogenization step. In illustrative embodiments, heat treating to accomplish chalcogenization occurs at a temperature in the range from 350° C. to 700° C., preferably 450° C. to 700° C., more preferably 550° C. to 650° C.

In many embodiments, the heat treatment also further comprises an aspect to help convert the precursor structure 102 into a more crystalline, chalcogenide semiconductor, also referred to as a photoactive chalcopyrite film. Desirably, this is practiced in a manner effect to provide substantially isotropic phase formation throughout the film. The aspect of the heat treatment that converts the precursor structure 102 into a more crystalline, semiconductor form also may be referred to as annealing the precursor. In many suitable embodiments, annealing is practiced at a temperature in the range from 400° C. to 700° C., preferably 550° C. to 650° C. The heat treatment(s) to accomplish chalcogenization and crystallization may occur at the same time or may be practiced separately.

The heat treatment is practiced to accomplish at least one of chalcogenization and/or annealing. For example, the annealing aspect may not be needed in some modes of practice. For instance, if sputtering occurred at a temperature below about 500° C., crystallization may be required to convert the precursor structure into a desired chalcopyrite structure with grains leading to high electronic quality. On the other hand, if the precursor had been sputtered above about 500° C. to accomplish reactive deposition, the precursor film may already be in the desired crystalline form and an anneal itself may not be needed. Even in such instances, it may be desirable to anneal in any event to improve crystalline characteristics. In such modes of practice, a heat treatment to accomplish chalcogenization is performed even if an annealing aspect is not needed or desirable.

The chalcogenization aspect may not be needed in some modes of practice if the precursor structure includes a sufficient amount of chalcogen content to form a desired chalcogenide semiconductor. Even in such instances, it may be desirable to chalcogenize in any event to improve chalcogen characteristics. For example, chalcogenization can be practiced to modify the sulfur, selenium, or tellurium content of a structure. In such modes or practice, a heat treatment to accomplish annealing is performed even if a chalcogenization aspect is not needed or desirable.

Depending upon temperatures being practiced, chalcogenization and annealing may occur at the same time or may occur sequentially. For example, chalcogenization may be practiced first at a relatively lower temperature, e.g., below about 400° C. or below 350° C. or even below 300° C., and then annealing is practiced by heating the precursor structure at a temperature greater than 400° C. but often below about 650° C. to avoid thermal damage. As one alternative, the precursor may be heated at a temperature in the range from 400° C. to 650° C. to accomplish chalcogenization and annealing at the same time.

Heat treating may occur for any duration effective to provide the desired chalcogenization or annealing result. As general guidelines, the heat treatment may occur for a time period in the range from about 10 seconds to about 2 hours, preferably 60 seconds to 1 hour, more preferably 5 min to 15 min. Additional time may be used to ramp temperature up and down according to a desired ramp profile. Ranges of ramp speeds commonly used include 30° C./min to 500° C./min or higher. The chalcogen source may be applied and removed at any time(s) during such ramps as desired. The chalcogen supply may be maintained as the sample cools down to approximately 200° C. to about 400° C. to help avoid loss of chalcogen from the near surface of the film.

Figure 5:
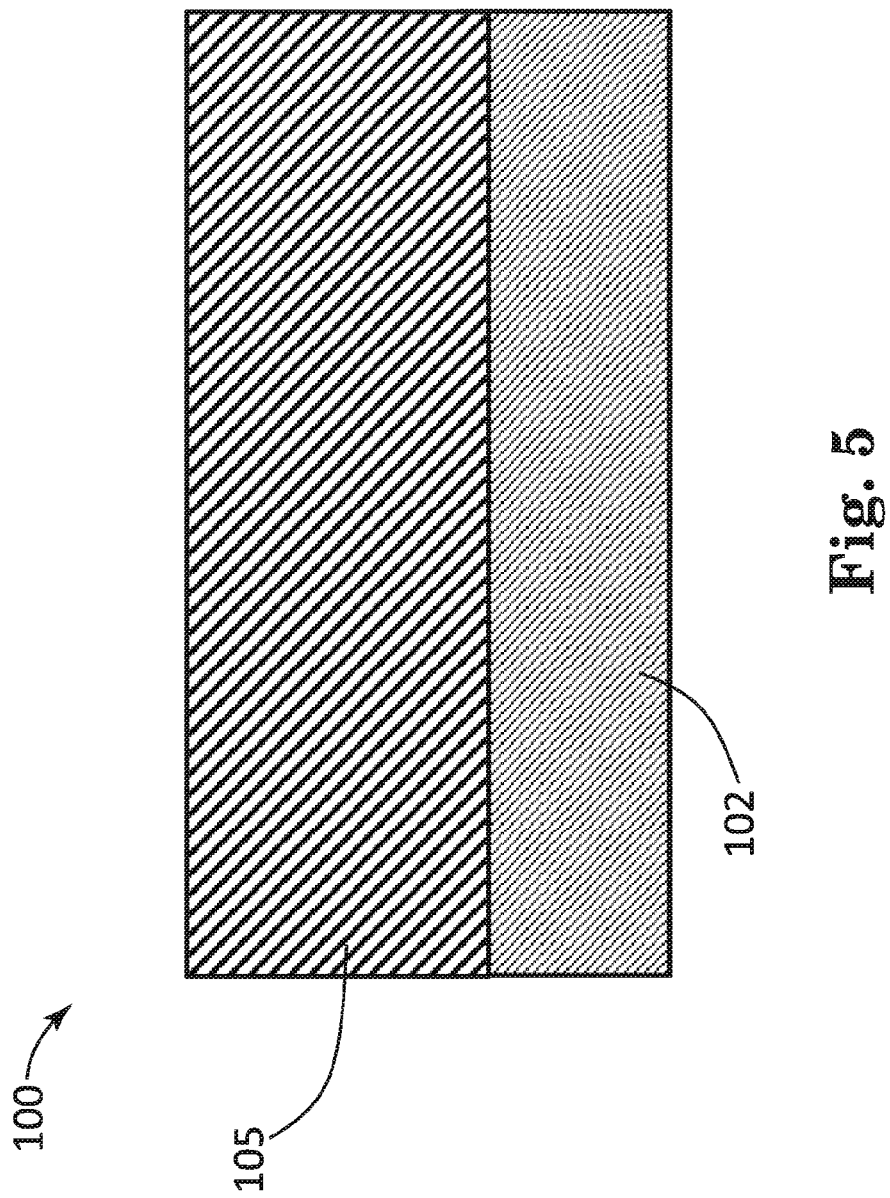
FIG. 5 schematically shows a cross section of an alternative embodiment of a workpiece on which a chalcogenide semiconductor is formed using principles of the present invention.

As a consequence of heat treating, at least a portion, more preferably at least substantially all of the precursor structure 102 is converted into a chalcogenide semiconductor 105 supported on substrate 102 of device 100 as shown in FIG. 5. As used herein, a chalcogenide semiconductor refers to a semiconductor composition comprising one or more chalcogen constituents. Chalcogens include sulfur, selenium, and tellurium. Oxygen (O) is technically a chalcogen according to its placement in the periodic table of the elements. However, oxygen is deemed not to be a chalcogen for purposes of the present invention inasmuch as oxygen does not contribute to photoabsorbing functionality to the extent of the other chalcogens such as S and/or Se.

Even though oxygen does not promote photoabsorbing functionality to the same degree and/or in the same manner as Se or S, oxygen may still be incorporated into the resultant semiconductor material to serve one or more other desired objectives. For example, many chalcogenide semiconductor materials could incorporate at least some oxygen as an impurity without significant deleterious effects upon electronic properties.

Examples of chalcogenide semiconductors include selenides, sulfides, tellurides, selenides-tellurides, suflides-tellurides, selenides-sulfides, and/or selenides-sulfides-tellurides. In many illustrative embodiments, a chalcogenide semiconductor includes at least one of copper, indium, aluminum, and/or gallium. Representative examples of such chalcogenide semiconductors comprise copper and indium. Other representative examples of such chalcogenide semiconductors comprise copper, indium, and gallium. Specific examples include but are not limited to copper indium selenides, copper indium gallium selenides, copper gallium selenides, copper indium sulfides, copper indium gallium sulfides, copper gallium selenides, copper indium sulfide selenides, copper gallium sulfide selenides, copper indium aluminum selenides and copper indium gallium sulfide selenides. The copper indium selenides and copper indium gallium selenides are preferred.

In the practice of the present invention, the resultant chalcogenide semiconductor desirably includes at least one alkali metal constituent, preferably at least one of Na, K and Li, more preferably Na. The one or more alkali metal content of the resultant semiconductor may be present in a variety of forms including but not limited to being present in elemental metal form, metal alloys, intermetallic compositions, compounds, and/or salts. In preferred embodiments, alkali content is present as elemental Na and/or elemental Li. The alkali content may be present in the same or different phase(s) than the chalcogenide material(s). Without wishing to be bound by theory, it is believed that the alkali content generally occurs along grain boundaries of the chalcogenide semiconductor. This is supported by microscopic mapping analysis, which shows the alkali content at these boundaries. Without wishing to be bound by theory, it is believed that the alkali content at the grain boundaries is associated with the chalcogenide material by physical or chemical bonds or other association.

The alkali content of the chalcogenide semiconductor provides many advantages. In particular, the alkali content improves electronic performance compared to otherwise identical materials without alkali content. Examples of electronic properties that are improved by alkali content include efficiency, fill factor, and open circuit voltage.

The amount of alkali content incorporated into the chalcogenide semiconductor may be selected from a wide range. If too little is present, desired improvements in electronic performance may not result to the degree desired. If too much is present, adhesion between the semiconductor and other layers could be reduced. For example, in one mode of practice, a chalcogenide precursor is formed from a relatively thin layer containing alkali content and a relatively thicker layer including additional precursor constituents. During the course of forming the precursor and/or the resultant chalcogenide semiconductor, the alkali content in the relatively thinner layer will tend to diffuse into the chalcogenide material. The chalcogenide material generally has a saturation level for the alkali content. If an excess of alkali material is present relative to this saturation threshold, diffusion of the excess material may not occur. The excess material could reside below and/or above the resultant chalcogenide semiconductor material and unduly reduce adhesion between the chalcogenide semiconductor material and adjacent layers. Accordingly, the alkali content as deposited and as incorporated into the chalcogenide semiconductor is at or below this saturation level. For many chalcogenide semiconductor materials, the saturation level may tend to occur when the atomic ratio of the alkali metal content to the total amount of metals is about 0.02:1.

Desirably, therefore, the atomic ratio of the alkali metal content to the total amount of metals and chalcogen in the chalcogenide semiconductor is up to 0.02:1, preferably in the range from 0.001:1 to 0.02:1, more preferably in the range from 0.01:1 to 0.02:1, even more preferably in the range from 0.01:1. The alkali content can be distributed throughout the entirety of the chalcogenide semiconductor or may be incorporated into one or more selected portions of the chalcogenide semiconductor. For example, alkali content may be present in a lower portion of region 18, a middle portion, or a top portion. In other embodiments, the alkali content may have a concentration gradient in which the amount of alkali content varies as a function of depth. For example, portions of the chalcogenide semiconductor proximal to the top of the chalcogenide semiconductor may be relatively richer in alkali content than lower regions.

One illustrative class of chalcogenide semiconductors incorporating alkali content may be represented by the formula $$Cu_a In_b Ga_c Se_w Na_z \quad (A)$$

wherein:
"a" is <1;
"a/(b+c)"<1, preferably 0.8 to 0.95;
"b+c" is approximately 1.0;
"c/(b+c)" is about 0.3;
"w" is approximately 2; and
"z" is 0.004 to 0.08 (i.e., up to approximately 2% of all other elements), preferably 0.008 to 0.04.

In one embodiment, a chalcogenide semiconductor has the composition Cu(23%)In(19%)Ga(8%)Se(50%):Na(1%), wherein the percentages are atomic percentages.

Figure 6:
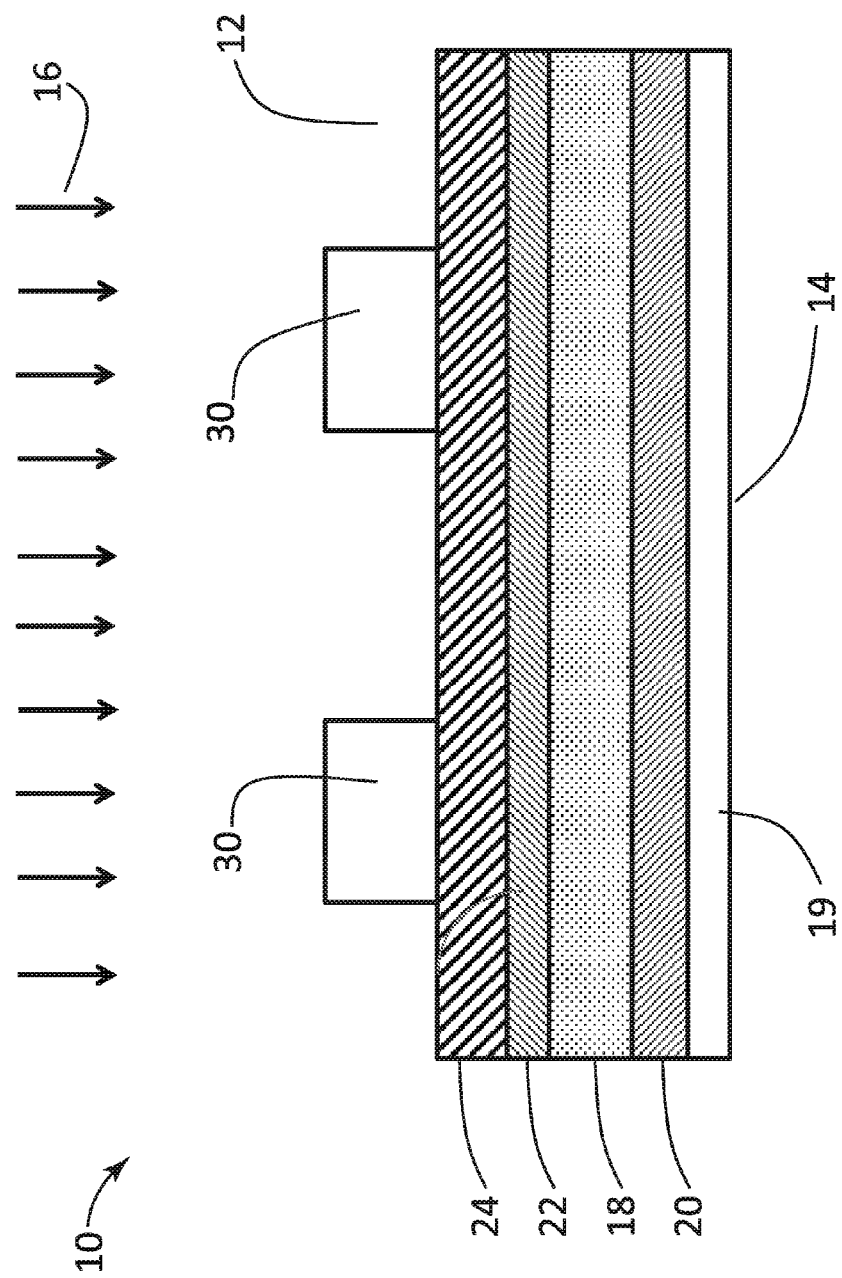
FIG. 6 schematically shows a photovoltaic device as an example of a microelectronic device that can be fabricated using principles of the present invention.

For purposes of illustration, FIG. 6 shows how chalcogenide semiconductors with alkali metal constituents may be incorporated into a microelectronic device, such as photovoltaic device 10 including a p-n heterojunctions. Device 10 includes a light incident face 12 that receives light rays 16 and a backside face 14. Device 10 uses photovoltaic principles to absorb light rays 16 and convert the light energy into electric energy.

In the illustrative device 10, the alkali metal-containing, chalcogenide semiconductor is incorporated into p-type semiconductor region 18. In many embodiments, region 18 may be a single integral film as illustrated. In some other embodiments, region 18 may be a film formed from one or more layers (not shown). If region 18 is a film comprising two or more layers, each layer may have the same or differing formulations than other layer(s). For example, a particular layer may have more Ga content than another layer. Each layer may have the same or a different morphology than other layer(s). For example, as taught in Applicant's co-pending US 2011-0192453-A1, a lower portion of region 18 may have a morphology with relatively fine crystalline domains to promote adhesion to the adjacent backside electrical contact region 20, while an upper portion of region 18 may incorporate relatively larger crystalline domains to promote more desired electronic performance.

The region 18 absorbs light energy embodied in the light rays 16 and then photovoltaically converts this light energy into electric energy. In terminology used by the industry, region 18 may be referred to as an absorber region due to the function of absorbing light energy and converting that energy into electric energy. The p-type semiconductor region preferably incorporates at least one chalcogenide semiconductor.

In many embodiments, at least a portion of the chalcogenide semiconductor(s) of region 18 may be present in polycrystalline form. Advantageously, these materials exhibit excellent cross-sections for light absorption that allow region 18 to be very thin and flexible. In illustrative embodiments, a typical region 18 may have a thickness in the range from about 0.5 µm to about 5 µm, preferably about 0.8 µm to about 3 µm, more preferably 1 µm to about 2 µm.

In addition to region 18, device 10 may also include one or more other components such as support 19, backside electrical contact region 20, n-type semiconductor region 22, and transparent conducting (TC) region 24. As shown, each of these regions can be a single integral layer as illustrated or can be formed from one or more layers. Additionally, one or more barrier layers (not shown) also may be provided over all or portions of device 10 for purposes such as to help isolate device 10 from the ambient and/or to electrically isolate device 10. One or more additional layers (not shown) may be deposited onto the backside of the support for a variety of reasons, including helping prevent selenization of the substrate during fabrication of the cell. Such one or more layers if present typically include molybdenum.

The support 19 may be rigid or flexible, but desirably is flexible in those embodiments in which the device 10 may be used in combination with non-flat surfaces, when light weight is important and as a way to provide high throughput, low cost, roll to roll manufacturing. Support 19 may be formed from a wide range of materials. These include glass, quartz, other ceramic materials, polymers, metals, metal alloys, intermetallic compositions, paper, woven or nonwoven fabrics, combinations of these, and the like. Stainless steel is preferred.

The backside electrical contact region 20 provides a convenient way to electrically couple device 10 to external circuitry. Contact region 20 may be formed from a wide range of electrically conductive materials such as one or more of Cu, Mo, Ag, Al, Cr, Ni, Ti, Ta, Nb, W combinations of these, and the like. Conductive compositions incorporating Mo may be used in an illustrative embodiment.

Optional layers (not shown), in addition to the support 19, may be used proximal to backside face 14 in accordance with conventional practices now known or hereafter developed to help enhance adhesion between backside electrical contact region 20 and the support 19 and/or between backside electrical contact region 20 and the region 18.

The device 10 as illustrated is provided with a heterojunction structure. A heterojunction may be formed between the p-type semiconductor region 18 and the n-type semiconductor region 22. An optional window region (not shown) also may be present. The n-type semiconductor region 22 generally comprises at least one n-type semiconductor material with a suitable band gap to help form a p-n heterojunction proximal to the interface between the region 18 and the region 22.

A wide range of n-type semiconductor materials may be used to form region 22. Illustrative materials include selenides, sulfides, and/or oxides of one or more of cadmium, zinc, lead, indium, tin, combinations of these and the like, optionally doped with materials including one or more of fluorine, sodium, lithium, combinations of these and the like. In some illustrative embodiments, region 22 is a selenide and/or sulfide including cadmium and optionally at least one other metal such as zinc. Other illustrative embodiments may include sulfides and/or selenides of zinc. A typical region 22 may have a thickness in the range from about 20 nm to about 200 nm.

Device 10 may include an optional intrinsic or resistive window region or layer (not shown). A window region can help to protect against shunts and also may protect region 22 during subsequent deposition of the TC region 24. The window region may be formed from a wide range of materials and often is formed from a resistive, transparent oxide such as an oxide of Zn, In, Cd, Sn, combinations of these and the like. An exemplary window material is intrinsic ZnO and/or AZO. A typical window region may have a thickness in the range from about 10 nm to about 200 nm.

The TC region 24 is interposed between the region 22 and light incident surface 12 and is electrically coupled to the region 22 to provide a top conductive electrode for the device 10. In many embodiments, region 24 comprises one or more transparent conductive oxides (TCO's) and/or very thin, light transmissive, transparent metal film. In many suitable embodiments where the TC region is a transparent conductive oxide (TCO), the TCO layer has a thickness in the range from about 10 nm to about 5000 nm, preferably about 150 nm to about 300 nm. As shown, the TCO region 24 is in direct contact with the region 22. As an example of another option, a window region may be interposed between TCO region 24 and region 22. One or more intervening layers optionally may be interposed for a variety of reasons such as to promote adhesion, enhance electrical performance, or the like.

A wide variety of transparent conducting oxides (TCO) or combinations of these may be incorporated into the transparent conductive region 24. Examples include fluorine-doped tin oxide, tin oxide, indium oxide, indium tin oxide (ITO), aluminum doped zinc oxide (AZO), zinc oxide, combinations of these, and the like. In one illustrative embodiment, the transparent conductive region 24 is indium tin oxide. TCO layers are conveniently formed via sputtering or other suitable deposition technique.

The transparent conductive region 24 may alternatively be a very thin metal film (e.g., a metal film having a thickness greater than about 5 nm and more preferably greater than about 30 nm. Additionally, the transparent conductive region is preferably less than about 200 nm thick, more preferably less than about 100 nm thick. These representative embodiments result in films that are sufficiently transparent to allow incident light to reach the absorber region 20). Preferably, the transparent conductive layer is a transparent conductive oxide. As used herein, the term "metal" refers not only to metals, but also to metal admixtures such as alloys, intermetallic compositions, combinations of these, and the like. These metal compositions optionally may be doped. Examples of metals that could be used to form thin, optically transparent layers 30 include the metals suitable for use in the backside electrical contact 28, combinations of these, and the like.

An electrically conductive collection grid 30 is positioned over TC region 24. Grid 30 can be formed from a wide range of electrically conducting materials, but most desirably is formed from one or more metals, metal alloys, or intermetallic compositions. Exemplary contact materials include one or more of Ag, Al, Cu, Cr, Ni, Ti, combinations of these, and the like. A grid 30 incorporating Ag or Ag/Ni contacts is preferred. In one illustrative embodiment, the grid has a dual layer construction comprising nickel and silver. Since these materials are not transparent, they are deposited as a grid of spaced apart lines so that the grid occupies a relatively small footprint on the surface (e.g., in some embodiments, the grid occupies about 5% or less, even about 2% or less, or even about 1% or less of the total surface area associated with light capture to allow the photoactive materials to be exposed to incident light).

Figure 7:
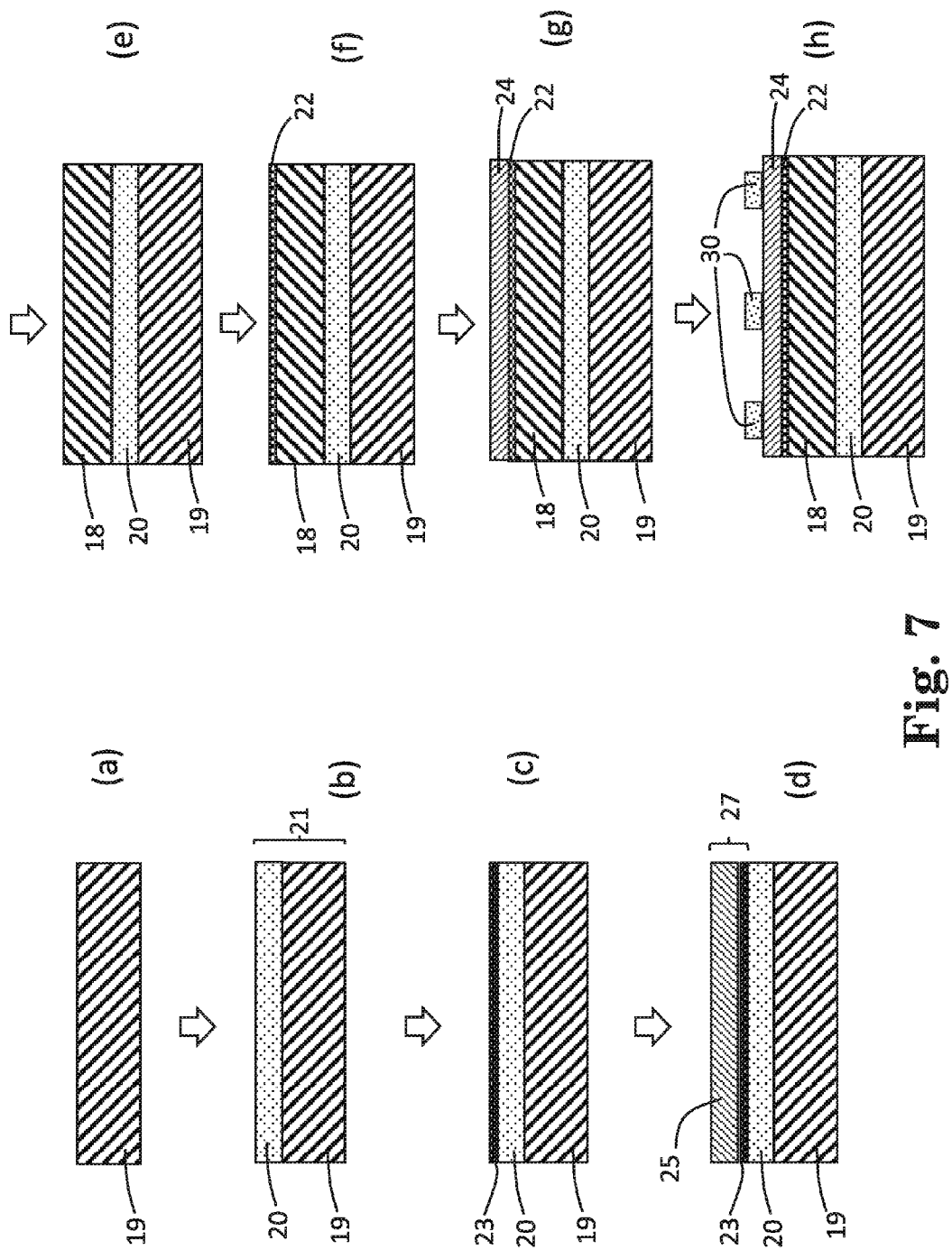
FIG. 7 schematically shows the steps used to make the device of FIG. 6 using sputtering or evaporation techniques to form a precursor portion of the p-type semiconductor region incorporated into device 10.

FIG. 7 schematically illustrates one strategy for fabricating device 10 of FIG. 6. In step (a), support 19 is provided. Back electrode 20 is formed on support 19 in step (b). Back electrode 20 is shown as a film having a single layer, but back electrode 20 could be made of multiple layers in some embodiments. Support 19 and back electrode 20 constitute a substrate 21 onto which a first film 23 (corresponding to first film 106 in FIG. 1) is sputtered in step (c) in accordance with principles of the present invention. Film 23 comprises one or more alkali metal compounds and at least one electrically conductive species. In step (d), a film 25 comprising a precursor of a chalcogenide semiconductor is deposited onto film 23. In one mode of practice, film 25 is formed by sputtering techniques. In another mode of practice, film 25 is formed by evaporation techniques. Film 25 corresponds to second film 108 of FIG. 1. Together, films 23 and 25 provide precursor structure 27. In step (e), the precursor structure 27 is heat treated in order to form p-type chalcogenide semiconductor region 18. An n-type semiconductor region 22 and optional window layer (not shown) are deposited onto region 18 in step (f). TC region 24 is formed on region 22 in step (g). Grid 20 is then formed on TC region 24 in step (h) to form device 10.

The present invention will now be further described with reference to the following illustrative examples.

Example 1

Preparation of NaF Containing Film Using Sputter Target A Containing 20 Atomic Percent Cu and 80 Atomic Percent NaF A small test target having dimensions of 1"×0.125" (25.4 mm×3.175 mm) and a circular shape contained 20 atomic percent Cu and 80 atomic percent NaF. The Cu and NaF were generally uniformly distributed throughout the target. Due to the low conductivity of the sputter target, AC and DC sputtering techniques were not used to evaluate how this target performs using AC and DC sputtering. Previous demonstrated ability to sputter pure NaF with RF sputtering methods indicates that RF sputtering techniques could be applied to this target as well.

Example 2

Preparation of NaF Containing Film Using Sputter Target B Containing 50 Atomic Percent Cu and 50 Atomic Percent NaF A test target having dimensions of 15.36"×2.95"×0.25" (390.14 mm×74.93 mm×6.35 mm) and a rectangular shape contained 50 atomic percent Cu and 50 atomic percent NaF. The Cu and NaF were generally uniformly distributed throughout the target. AC and DC sputtering techniques were used to sputter the target to form respective films. The tests showed that a target of this composition sputters easily using AC techniques. When DC techniques were used, the sputter system did not remain fired. Previous demonstration of RF methods for targets of lower conductivity indicate that RF methods could be applied to this target as well. This evaluation shows that both RF and AC sputtering techniques are useful to sputter a target of this composition.

Example 3

Preparation of NaF Containing Film Using Sputter Target C Containing 80 Atomic Percent Cu and 20 Atomic Percent NaF A small test target having dimensions of 1"×0.125" (25.4 mm×3.175 mm) and a circular shape contained 80 atomic percent Cu and 80 atomic percent NaF. The Cu and NaF were generally uniformly distributed throughout the target. DC sputtering techniques were used to sputter the target to form respective films. The tests showed that a target of this composition sputters easily using DC techniques while previous experience with targets of a lower conductivity indicates that AC or RF methods could be applied to this target as well. This evaluation shows that all of RF, AC, and DC sputtering techniques are useful to sputter a target of this composition.

Comparison Example A

Preparation of NaF Containing Film Using Sputter Target D Containing 100 Atomic Percent NaF A test target having dimensions of 15.36"×2.95"×0.125" (390.14 mm×74.93 mm×6.35 mm) and a rectangular shape contained 100 atomic percent NaF. RF sputtering techniques were used to sputter the target to form a film. The test showed that a target of this composition can be used to sputter deposit NaF but at a reduced deposition rate and not without risking cracking of the target material if higher power is used. Due to the low conductivity of the sputter target, AC and DC sputtering techniques were not used to evaluate how this target performs using AC and DC sputtering.

Example 4

Preparation of Photovoltaic Devices Using Sputter Target B Containing 50 Atomic Percent Cu and 50 Atomic Percent NaF to Form 30 nm Film Target B of Example 2 (having dimensions of 15.36"×2.95"×0.125" (390.14 mm×74.93 mm×6.35 mm) and a rectangular shape contained 50 atomic percent Cu and 50 atomic percent NaF) was used to fabricate photovoltaic devices (Samples 4A) using the following procedure.

A flexible, stainless steel support is provided. The support is a web having a crossweb dimension of about 13 inches. The web is supplied from a supply or pay out roll to a take up roll. Although optional surface treatment may be used to clean or wipe the stainless steel, such optional surface treatments were not practiced in this example. The bottom of the support is coated with Mo as a barrier to help isolate the stainless steel from high temperature exposure to Se. Sputtering is used to deposit the Mo coating. The web moves at about 0.5 m/min during deposition of the Mo coating.

Next, a back electrode is formed on the top of the stainless steel support. The back electrode is formed from two layers. Sputtering is used to form layers of Ti and Mo of approximately 320 nm and 600 nm thickness, respectively. Ar gas is used to provide ion bombardment of metal planar targets for the Ti and Mo layers, respectively. No heat is applied to the workpiece when forming either layer other than that obtained from the plasma. Ar pressure is maintained with a fixed mass flow for a pressure of about 5 mtorr. The web moves at about 0.5 m/min during deposition of each of the Ti and Mo coatings.

Next a precursor structure is formed on the back electrode. This is accomplished in two main stages. First, Target B is used to form a first layer on the back electrode, wherein the first layer includes Cu and NaF. The first layer has approximately the same composition as Target B. The first layer has a thickness of 30 nm. To accomplish sputtering, the following sputter conditions are used: pressure is 2 mtorr; power is 1 kW AC; web speed is adjusted to achieve the desired thickness, e.g., 2.2 mm/s for a 45 nm coating.

As a second stage of forming the precursor structure, a precursor of a chalcogenide semiconductor is formed as a second layer on the first layer. The second layer has a thickness of 575 nm. The second layer is formed by sputtering multiple targets in the presence of evaporated, Se vapor created by evaporation of elemental Se. to provide a precursor composition containing Cu, Ga, and In at an atomic ratios of approximately 44.4:38.9:16.7, respectively. The precursor composition includes about 40 atomic percent of the stoichiometric amount of Se needed to form the desired chalcogenide semiconductor. Sputtering occurs at a temperature of about 200 C-250 C to form the second layer. The relative amounts of the first and second layers is intended to provide an amount of Na such that the resultant chalcogenide semiconductor includes no more than 2 atomic percent Na, more preferably 0.5 to 1 atomic percent Na.

The precursor structure is then heat treated in the presence of selenium created by evaporation of elemental Se to convert the precursor structure to a p-type chalcogenide Cu(In, Ga)Se2 (CIGS) semiconductor containing Na content. Heat treating occurs between 550 C and 600 C for 7 minutes in a vacuum environment at 1 to 5 mTorr.

Next, an n-type buffer layer of CdS is formed on the CIGS semiconductor. The layer has a thickness of 70 nm and is formed by chemical bath deposition. A layer of oxygen-doped AlZnO is formed on the CdS layer. A transparent conductive oxide (InSnO) layer is then formed on the AlZnO) layer.

An array of microcells is formed on the web by mechanically scribing the web into 0.15 cm2, isolated areas. Suitable probes can be coupled to each area independently to evaluate properties such as efficiency and open circuit voltage while exposing the areas to a calibrated light source and performing a current voltage sweep.

Example 5

Preparation of NaF Containing Film 2 Using Sputter Target B Containing 50 Atomic Percent Cu and 50 Atomic Percent NaF to Form 45 nm Film The process of Example 4 is used to fabricate microcells (Samples 5A) except that the first layer of the precursor structure on the web has a thickness of 45 nm.

Comparison Example B

Preparation of Photovoltaic Device Sample B Using Evaporation Techniques to Provide NaF Layer of Precursor Structure The process of Example 4 is used to fabricate microcells (Comparison Samples B) except that the first layer of the precursor structure on the web is formed by evaporating NaF to form a film having a thickness of 20 nm.

Example 6

Figure 8:
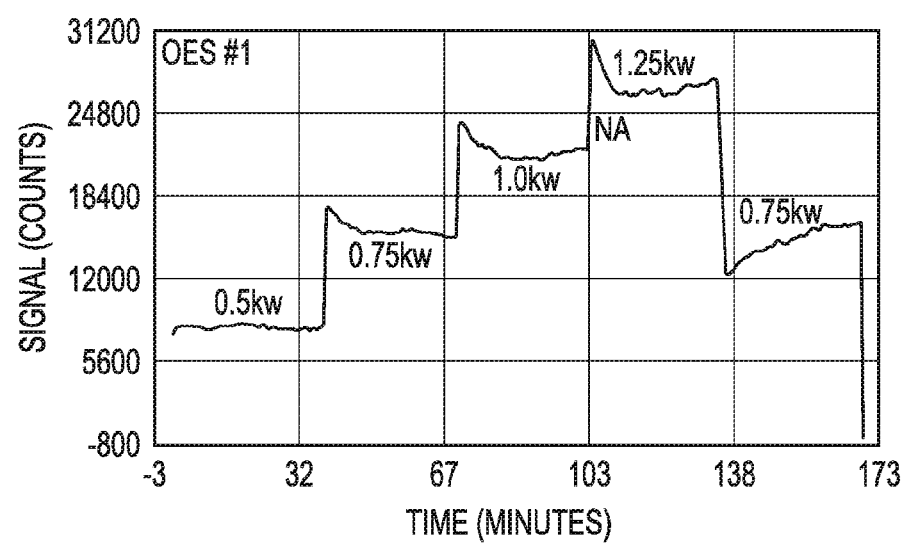
FIG. 8 is a graph showing Na emission lines as a function of sputter power obtained in accordance with Example 6.

Optical Emission Spectroscopy (OES) Evaluation of the Impact of Sputter Power Upon Na Emission Line and Repeatability Target B is sputtered using AC sputter techniques at different sputter powers of 0.5 kW, 0.75 kW, 1.0 kW, 1.25 kW, and then 0.75 kW again, respectively. The Na emission line of Na in the plasma at each power level is monitored over time. The results are shown in FIG. 8. FIG. 8 shows that the Na emission line at each power level is substantially uniform over time periods of about 35 to 36 minutes, respectively. This shows that Na content in the plasma, and hence the sputter rate, is a strong function of sputter power level. FIG. 8 also shows how returning to a sputter power level of 0.75 kW during the time period extending from 138 minutes to 173 minutes provides levels of Na that are very similar to the levels of Na measured at 0.75 kW from 32 minutes to 67 minutes. This shows that the Na content as a function of power level is repeatable and uniform.

Example 8

Evaluation of Device Efficiency

Figure 9:
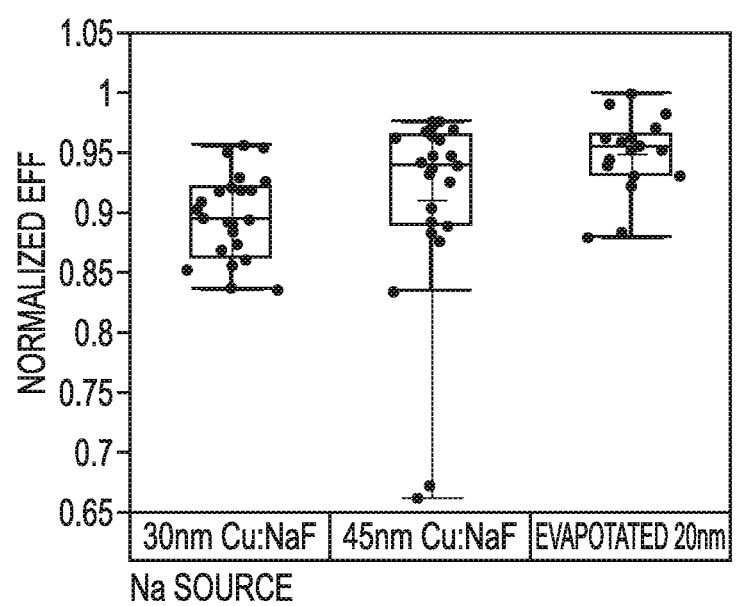
FIG. 9 is a graph showing the efficiency (normalized fill factor) of devices obtained from Examples 4, 5 and Comparison B.

The relative or normalized efficiency of microcells obtained from Examples 4, 5 and Comparison B is measured and compared. The results are shown in FIG. 9. The 20 nm NaF data corresponds to devices of Comparison Sample B, wherein the first film of the precursor has a thickness of 20 nm and is formed by evaporation. The 30 nm film Cu:NaF data corresponds to the devices of Sample 4A. The 45 nm film Cu:NaF data corresponds to the devices of Sample 5A. The outlying data points associated with two of the devices 5A according to Example 5 (45 nm NaF film) are associated with anomalously high series resistance that is likely the result of poor contact or measurement error. In fact, if these points are excluded from statistical analysis, the efficiency of the control evaporated NaF is the statistically equivalent to 45 nm Cu:NaF. This indicates that the use of Cu:NaF at a sufficient thickness is equivalent to the control sample obtained from evaporated NaF with respect to efficiency.

Example 9

Evaluation of Device Open Circuit Voltage

Figure 10:
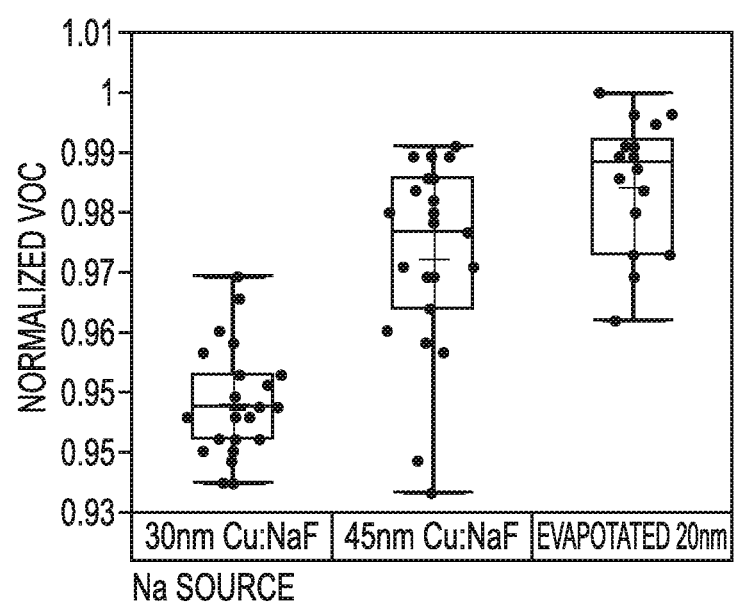
FIG. 10 is a graph showing normalized open circuit voltage (Voc) of devices obtained from Examples 4, 5 and Comparison B

The relative or normalized open circuit voltage (Voc) of microcells obtained from Examples 4, 5 and Comparison B is measured and compared. The results are shown in FIG. 10. The 20 nm NaF data corresponds to devices of Comparison. Sample B, wherein the first film of the precursor has a thickness of 20 nm and is formed by evaporation. The 30 nm film Cu:NaF data corresponds to the devices of Sample 4A. The 45 nm film Cu:NaF data corresponds to the devices of Sample 5A. The outlying data points associated with two of the devices 5A according to Example 5 (45 nm NaF film) are believed to be the result of poor contact and therefore measurement error. This indicates that the use of Cu:NaF at a sufficient thickness is equivalent to the control sample obtained from evaporated NaF with respect to open circuit voltage.

The invention claimed is:

1. A method of making a chalcogenide semiconductor, comprising the steps of:
   (a) providing a substrate;
   (b) forming a precursor structure on the substrate, said precursor structure comprising one or more alkali metal compound-containing films and one or more chalcogenide semiconductor precursor films, wherein:
      (i) each of the one or more alkali metal compound-containing films comprises at least one conductive species and at least one alkali metal compound, wherein the atomic ratio of the one or more alkali metal compounds to the at least one conductive species in the film is in the range from 15:85 to 85:15;
      (ii) each of the one or more chalcogenide semiconductor precursor films comprise a chalcogenide semiconductor precursor comprising Cu, In, at least one of Ga and/or Al, and at least one chalcogen as deposited, (iii) each of the one or more alkali metal compound-containing films is formed by a method comprising sputtering at least one target comprising one or more alkali metal compounds and at least one conductive species, wherein the atomic ratio of the one or more alkali metal compounds to the at least one conducive species in said target is in the range from 15:85 to 85:15; and (iv) the one or more alkali metal compound-containing films are present in the precursor structure an amount such that the chalcogenide semiconductor comprises up to 2 atomic percent alkali metal content based on the total composition of the chalcogenide semiconductor, and such that a major portion of the alkali metal content of the chalcogenide semiconductor is derived from the one or more alkali metal compound-containing films; and (c) heat treating the precursor structure in the presence of at least one chalcogen under conditions effective to convert at least a portion of the precursor structure into a chalcogenide semiconductor comprising up to 2 atomic percent of alkali metal content.

2. The method of claim 1, wherein the at least one conductive species comprises Cu.

3. The method of claim 1, wherein the at least one conductive species comprises Ga and/or In.

4. The method of claim 1, wherein the at least one alkali metal compound comprises a fluoride.

5. The method of claim 1, wherein the at least one alkali metal compound comprises at least one of NaF, LiF, KF.

6. The method of claim 1, wherein the at least one alkali metal compound comprises at least two of Na, Li, and K.

7. The method of claim 1, wherein the atomic ratio of the one or more alkali metal compounds to the at least one conducive species in said target is in the range from 40:60 to 60:40.

8. The method of claim 1, wherein step (b) comprises using AC or DC sputtering techniques to sputter at least one target comprising at least one conductive species and at least one alkali metal compound, wherein the atomic ratio of the one or more alkali metal compounds to the at least one conductive species in the film is in the range from 15:85 to 85:15.

9. The method of claim 1, wherein the alkali metal compound-containing film has a thickness in the range from 10 nm to 150 nm and the chalcogenide semiconductor precursor film has a thickness in the range from about 0.4 μm to about 2 μm.

10. The method of claim 1, wherein the first film is present in the precursor structure an amount such that the chalcogenide semiconductor comprises 0.1 to 2 atomic percent alkali metal content based on the total composition of the chalcogenide semiconductor.

11. The method of claim 1, wherein an alkali metal-containing film formed instep (b) is formed as a first film on the substrate and has a thickness in the range from 10 nm to 150 nm, and wherein a chalcogenide semiconductor precursor film formed in step (b) is formed as a second film on the first film.

12. The method of claim 1, wherein a chalcogenide semiconductor precursor film formed in step (b) is formed as a first film on the substrate, and wherein an alkali metal-containing film formed in step (b) is formed as a second film on the first.

13. The method of claim 1, wherein step (b) comprises forming a chalcogenide semiconductor precursor film with a substoichiometric amount of the at least one chalcogen.

14. The method of claim 1, wherein step (b) comprises forming a chalcogenide semiconductor precursor film in the presence of Se-containing vapor.

* * * * *